United States Patent
Pöppe et al.

(10) Patent No.: US 11,415,628 B2
(45) Date of Patent: Aug. 16, 2022

(54) AUTOMATED TEST EQUIPMENT FOR TESTING ONE OR MORE DEVICES UNDER TEST, METHOD FOR AUTOMATED TESTING OF ONE OR MORE DEVICES UNDER TEST, AND COMPUTER PROGRAM USING A BUFFER MEMORY

(71) Applicant: Advantest Corporation, Tokyo (JP)

(72) Inventors: Olaf Pöppe, Tübingen (DE);
Klaus-Dieter Hilliges, Stuttgart (DE);
Alan Krech, Fort Collins, CO (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/094,047

(22) Filed: Nov. 10, 2020

(65) Prior Publication Data

US 2021/0055347 A1 Feb. 25, 2021

Related U.S. Application Data

(63) Continuation of application No. PCT/EP2020/051540, filed on Jan. 22, 2020.
(Continued)

(51) Int. Cl.
*G01R 31/3183* (2006.01)
*G01R 31/319* (2006.01)
*G01R 31/317* (2006.01)
*G01R 31/3177* (2006.01)
*G06F 13/20* (2006.01)
*G06F 11/273* (2006.01)

(52) U.S. Cl.
CPC . *G01R 31/318307* (2013.01); *G01R 31/3177* (2013.01); *G01R 31/31712* (2013.01); *G01R 31/31713* (2013.01); *G01R 31/31724* (2013.01); *G01R 31/31905* (2013.01); *G01R 31/31907* (2013.01); *G01R 31/31908* (2013.01); *G01R 31/31926* (2013.01); *G06F 11/2733* (2013.01); *G06F 13/20* (2013.01)

(58) Field of Classification Search
None
See application file for complete search history.

(56) References Cited

U.S. PATENT DOCUMENTS 5,103,450 A * 4/1992 Whetsel ......... G01R 31/318555
714/724
5,321,702 A 6/1994 Brown et al.
(Continued)

FOREIGN PATENT DOCUMENTS

TW 201337236 A 9/2013
TW 201433802 A 9/2014

*Primary Examiner* — Guerrier Merant

(57) ABSTRACT

An automated test equipment for testing one or more devices under test comprising a plurality of port processing units, comprising at least a respective buffer memory, and a respective high-speed-input-output, HSIO, interface for connecting with at least one of the devices under test. The port processing units are configured to receive data, store the received data in the respective buffer memory, and provide the data stored in the respective buffer memory to one or more of the connected devices under test via the respective HSIO interface for testing the one or more connected devices under test. A method and computer program for automated testing of one or more devices under test are also described.

23 Claims, 8 Drawing Sheets

Related U.S. Application Data

(60) Provisional application No. 62/795,456, filed on Jan. 22, 2019.

(56) References Cited

U.S. PATENT DOCUMENTS

| | | | |
|---|---|---|---|
| 6,424,926 | B1 | 7/2002 | Mak |
| 6,460,152 | B1 | 10/2002 | Demidov et al. |
| 7,562,271 | B2 * | 7/2009 | Shaeffer ............... G11C 11/4094 714/724 |
| 10,161,993 | B2 * | 12/2018 | Frediani ............ G01R 31/31907 |
| 2003/0009715 | A1 * | 1/2003 | Ricchetti ................ G11C 29/56 714/727 |
| 2005/0060600 | A1 * | 3/2005 | Jeddeloh ............... G11C 29/14 714/5.11 |
| 2006/0156113 | A1 | 7/2006 | Whetsel |
| 2008/0114562 | A1 | 5/2008 | Sul et al. |
| 2008/0114563 | A1 | 5/2008 | Kappauf et al. |
| 2010/0003837 | A1 * | 1/2010 | Loughner ................ G11C 5/04 439/64 |
| 2010/0023294 | A1 | 1/2010 | Fan et al. |
| 2010/0312517 | A1 | 12/2010 | McNamara et al. |
| 2011/0004793 | A1 | 1/2011 | Sul et al. |
| 2011/0015891 | A1 | 1/2011 | Kappauf et al. |
| 2011/0273197 | A1 | 11/2011 | Banerjee et al. |
| 2012/0221285 | A1 | 8/2012 | Conner |
| 2014/0114603 | A1 | 4/2014 | Moon et al. |
| 2014/0236524 | A1 | 8/2014 | Frediani et al. |
| 2014/0236525 | A1 * | 8/2014 | Chan ................ G01R 31/31907 702/119 |
| 2014/0236526 | A1 | 8/2014 | Frediani et al. |
| 2014/0237292 | A1 | 8/2014 | Chan |
| 2014/0244204 | A1 | 8/2014 | Frediani |
| 2015/0028908 | A1 | 1/2015 | Kushnick et al. |
| 2018/0196103 | A1 | 7/2018 | Champoux et al. |
| 2018/0275198 | A1 * | 9/2018 | Maekawa ...... G01R 31/318544 |
| 2018/0293786 | A1 * | 10/2018 | Insko .................. H04N 13/279 |

* cited by examiner

AUTOMATED TEST EQUIPMENT FOR TESTING ONE OR MORE DEVICES UNDER TEST, METHOD FOR AUTOMATED TESTING OF ONE OR MORE DEVICES UNDER TEST, AND COMPUTER PROGRAM USING A BUFFER MEMORY

CROSS-REFERENCE TO RELATED APPLICATIONS

This application is a continuation of co-pending International Application No. PCT/EP2020/051540, filed Jan. 22, 2020, and titled "Automated Test Equipment For Testing One or More Devices Under Test, Method for Automated Testing of One or More Devices Under Test, and Computer Program Using a Buffer Memory" which is incorporated herein by reference in its entirety, which claims priority to U.S. Provisional Application 62/795,456 entitled "Testing Concepts, For Example For Onchip-System Test (OCST),", filed Jan. 22, 2019, and hereby incorporated by reference in its entirety.

TECHNICAL FIELD

Embodiments according to the present invention are related to an automated test equipment for testing one or more devices under test.

Further embodiments according to the present invention are related to a method for automated testing of one or more devices under test.

Further embodiments according to the invention are related to respective computer programs.

Embodiments according to the invention are related to testing of devices i.e. receiving data from the devices under test, DUT, via a high-speed-input-output interface, HSIO, and providing data to the DUTs via the HSIO.

BACKGROUND OF THE INVENTION

In the following, an introduction into some conventional solutions will be provided.

Automated test equipment (ATE) is any apparatus that performs tests on a device, known as the device under test (DUT), using automation to quickly perform measurements and evaluate the test results. An ATE can be a simple computer-controlled digital multimeter, or a complicated system containing dozens of complex test instruments—real or simulated electronic test equipment—capable of automatically testing and diagnosing faults in sophisticated electronic packaged parts or on wafer testing, including system on chips and integrated circuits.

Structural tests enable systematic test coverage of individual structures, so-called cells, implementing the complex functions of a digital block within an System on a Chip, SOC. Structural test includes a variety of test methods including, but not limited to Memory built-in self-test, BIST, Logic BIST (pattern generated on-chip) and Scan Test (pattern externally provided). Individual tests are combined to test blocks: e.g. scan test is hierarchically applied to blocks (serially or in parallel).

Advanced structural test methodologies apply a combination of externally provided test data (stimulus from Automated Test Equipment, ATE) and on-chip device for testing, DFT, that expands externally provided test data, so-called seeds, into scan chains. Test results are compacted and compressed into a reduced amount of test data provided to the primary input-output interface, IO, of a SOC. This data is called received data and is compared by the ATE with expected data. The received data can also be masked by the ATE.

The DFT, also sometimes called design for testing or design for testability typically consists of integrated circuit design techniques that add testability features to a hardware product design or device, i.e. the DUT. The added features make it easier to develop and apply tests to the DUT.

The following refers to Scan Test as general representation of structural test as described above.

However, there are challenges to cost-effectively scaling scan tests with the increasing complexity of SOCs enabled by new fabrication processes.

One challenge is the escalating amount of test data that needs to be stored on the ATE. Another challenge is the escalating test times to feed the test data through the SOC IO. Also the increasing on-chip complexity is challenging the distribution of test data to blocks-under-test and to create the required clock signals.

In addition, quality and reliability expectations of complex SOCs require structural tests when the SOC is deployed in the end-application: e.g. in automobile or communication infrastructure system.

In view of this situation, there is a desire for a concept which provides for an improved compromise between data to be stored, processing speed and quality and reliability of tests when testing devices under test with an automated test equipment.

SUMMARY OF THE INVENTION

An embodiment according to the present invention is an automated test equipment for testing one or more devices under test.

The automated test equipment comprises a plurality of port processing units.

The port processing units comprise at least a respective buffer memory, and a respective high-speed-input-output, HSIO, interface for connecting with at least one of the devices under test, and receive data, store the received data in the respective buffer memory, and provide the data stored in the respective buffer memory to one or more of the connected devices under test via the respective HSIO interface for testing the one or more connected devices under test.

The data, that the port processing units receive can be shared data, e.g. data which is shared between a plurality of port processing units, e.g. shared stimulus data used to send to the DUTs for testing. The data can e.g. be received from a shared memory pool or from another port processing unit, possibly via another port processing unit.

The data, which can be shared, can be provided to the DUTs e.g. for providing test data or test programs to the device under test via an interface, which can be the HSIO or another interface, on the basis of the shared data from the shared memory pool.

Alternatively, data can be provided to the DUTs for providing test signals for the device under test on the basis of the shared data from the shared memory pool.

Alternatively, data can be provided to the DUTs for defining expected signals or expected results from the device under test on the basis of the shared data.

Any combination of the above is also possible, since the data that is provided to the one or more DUTs can be a combination of the options detailed above.

HSIO interface refer to interfaces that are designed for high speed communication. A non-exhaustive list of examples is USB, PCIe, SATA, Gigabit LAN. Devices under test, DUTs, can e.g. be Systems-on-a-chip, SOCs.

This embodiment is based on the idea that testing a device under test requires data transmission in both directions between the ATE and the DUTs. Some of these transmissions are transmitted via the HSIO.

In a preferred embodiment of the automated test equipment the respective buffer memory is accessible by the respective high-speed-input-output, HSIO, interface as local memory.

It has been found that it is beneficial if the respective buffer memory of a port processing unit is accessible by the respective high-speed-input-output, HSIO, interface as local memory, thereby avoiding unnecessary translations of memory addresses. One option to address the memory contents via the HSIO is via direct memory access, DMA. The respective buffer memory is thus coupled to the HSIO as local memory.

In a preferred embodiment of the automated test equipment, the ATE further comprises a data store comprising a shared memory pool, and the port processing units further receive shared data from the shared memory pool.

It has been found to be beneficial, as indicated above, that the data can be shared between port processing units. In order to share the data, the ATE has a shared memory pool to store the shared data, e.g. data which is shared between a plurality of port processing units, e.g. shared stimulus data for testing of the DUTs, and the port processing units receive the shared data from the shared memory pool, e.g. to fill the buffer with data received from the shared memory pool.

In a preferred embodiment of the automated test equipment, the data store further streams shared data to one or more of the port processing units and/or to a memory hub.

It has been found that the architecture for the ATE can comprise port processing units with dedicated memories, but also a memory hub can be employed to enhance the overall efficiency.

In a preferred embodiment of the automated test equipment, the data store further stores per-device result data into a plurality of memory areas.

It has been found that the ATE can store the results or result streams on a per-device basis, which may, for example, be provided by the port processing units into different memory areas. This might be beneficial, since the data rates of the per-DUT result data may be different from each other, e.g. smaller, for example, at least by a factor of ten, than the data rate of another result or result stream. Also, the volume and bandwidth required for storing results is significantly smaller than for shared stimulus data.

In a preferred embodiment of the automated test equipment, one or more of the port processing units, PPUs, further forward shared data from the shared memory pool to at least one other port processing unit.

It has been found to be beneficial, that the PPUs can transmit data between each other. Thus one PPU, that received shared data from the shared memory pool can forward the data to another PPU, such that the shared memory pool can be disburdened.

In a preferred embodiment of the automated test equipment, one or more of the port processing units are configured to receive shared data from at least one other port processing unit.

It has been found to be beneficial, that the PPUs can transmit data between each other. Thus one PPU can receive shared data from another PPU, which received the shared data from the shared memory pool, such that the shared memory pool can be disburdened.

In a preferred embodiment of the automated test equipment, one or more of the plurality of port processing units form a daisy chain to successively forward shared data from the shared memory pool.

It has been found that one way of such forwarding and receiving of shared data to and from PPUs can be effected by forming a daisy chain out of the PPUs.

In a preferred embodiment of the automated test equipment, one or more of the plurality of port processing units are configured to receive shared data from a memory hub.

It has been found that alternatively, the PPUs can also receive the shared data from a memory hub. If the memory hub serves more than one PPU with shared data, it could also be considered to be a central memory hub.

In a preferred embodiment of the automated test equipment, the port processing units comprise a buffering memory and/or one or more caches, in order to allow for a time-shift between a reception of shared data and a usage of the shared data for testing one or more connected devices under test.

It has been found that the buffering memory, e.g. a first-in-first-out, FIFO, memory can help to reduce delays and provide more of the required data for speeding up the processing. Likewise caches can be employed to reduce hold-ups in the processing and to have more of the data available at virtually the same time for usage by the PPU.

In a preferred embodiment of the automated test equipment, at least one of the port processing units further provides test information, which is based on the shared data, to a device under test via an interface, and to characterize a device under test in dependence on a timing of the transfer of the test information to the device under test.

It has been found that the PPUs can provide test information e.g. a test program or test data, to the DUTs on the basis of the shared data via an interface, e.g. the HSIO. Also the PPU can then characterize a device under test, e.g. determine the DUT type and/or identify the DUT, in dependence on a timing of the transfer of the test information to the device under test. For that the timing of the transfer of the test information is determined or affected by the device under test, e.g. because the device under test controls the interface, e.g. as a master device, or because the device under test can slow down or interrupt the transfer as a slave device.

In a preferred embodiment of the automated test equipment, at least one of the port processing unit is configured to characterize a device under test as failing if a transfer of test information to the device under test lags behind a reception of shared data by the respective port processing unit by more than a predetermined time.

It has been found that in order to improve overall performance of the ATE, its PPU can characterize or identify a DUT as failing, i.e. determine that the DUT is malfunctioning, if data transmission to or from the DUT exceeds a certain temporal threshold, i.e. if communication of the ATE with the DUT cannot be performed or completed within a predetermined time frame. The predetermined time frame, can e.g. be user-specified, device-specific, or test-specific.

In a preferred embodiment of the automated test equipment, the port processing units further obtain per-device result data and to forward the per-device result data to the data store.

It has been found that the overall ATE communication can be improved, if the PPUs obtain the result data, e.g. result streams or failure data, on a per-device, i.e. per-DUT, basis and forward the per-device result data, e.g. per-DUT result streams or per-DUT fail data to the data store.

In a preferred embodiment of the automated test equipment, the port processing units further obtain the per-device result data using expect data which are based on the shared data.

It has been found that the overall ATE data processing can be improved, if the PPUs obtain the per-device result data, e.g. per-DUT result streams or per-DUT fail data using expect data, wherein the expect data are based on the shared data.

In a preferred embodiment of the automated test equipment, the ATE comprises a memory hub for coupling a plurality of port processing units with the data store in a star architecture.

It has been found that a star architecture is a viable option for implementing a memory hub, which serves as the data store or shared memory pool for the PPUs.

In a preferred embodiment of the automated test equipment, the memory hub comprises a buffering memory and/or one or more caches, to allow for a non-simultaneous forwarding of shared data to different port processing units.

It has been found that the buffering memory, e.g. a first-in-first-out, FIFO, memory can help to reduce delays and provide more of the required data for speeding up the processing. Likewise caches can be employed to reduce hold-ups in the processing and to have more of the data available at virtually the same time for usage by the memory hub. Thereby, by holding more of the shared data in a buffering memory or caches, the relevant data can be forwarded at different times to different PPUs without multiple read accesses to the shared memory pool or data store.

In a preferred embodiment of the automated test equipment, the data store further comprises separate interfaces for the shared data which are provided to the port processing units and for the per-device result data.

It has been found by using separate interfaces for providing the shared data to the PPUs and for providing the per-device results, overall performance of the ATE can be improved.

In a preferred embodiment of the automated test equipment, the data store comprises a memory interface to access per-device result data without interfering with a provision of shared data to the port processing units.

It has been found that it is beneficial, if the data store has a memory interface to access, e.g. read out, per-device result data, e.g. for post processing or uploading, without interfering with a provision, e.g. by the data store via the HSIO or other interface, of shared data to the port processing units.

In a preferred embodiment of the automated test equipment, the port processing units further comprises a streaming error detection block, for detecting a command error in the received data, and comparing the received data with pre-loaded expect data, the expect data preferably comprising mask data.

It has been found that it is beneficial if the port processing unit comprises a streaming error detecting block for detection of a command error. Testing a device under test generates result data which can be compared to expect data, which indicates what a properly functioning device under test would return as result.

It has been found that in order to verify the correct functioning of the device under test, DUT, so-called expect data can be prepared and pre-loaded at the ATE. The received data can then be compared with the expect data and thus the correct functioning of the device can be determined. The received data can refer to data from the scan chain, command and/or payload data.

By using mask data, i.e. data defining which bits of the received data should contain which contests, the ATE can be enabled to process the data more intelligent. As an example, the expect data can contain mask data, which indicates that for a certain test procedure the received data will contain three blocks of data, the command indicating the pertinent test, the result data which was produced by the DUT and the seed data, which was used by the DUT to produce the result. Since the ATE supplied the DUT with the seed, storing of the seed might not be necessary in dependence of the test. Also, by selectively storing the result data, additional memory space can be saved.

In a preferred embodiment of the automated test equipment, the ATE can further pre-load the expect data into a per-device first-in-first-out, FIFO, memory or a managed cache associated with one or more connected devices.

It has been found that the ATE can thus pre-load expect data into a first-in-first-out, FIFO, memory, for a device, and thereby have expect data prepared for a quicker comparison with the received data. This is particular beneficial, if the received data is expected to be in a certain order, such that the first pre-loaded, first-in, data will also be the first to be compared and thus can be discarded from the FIFO first, too, first-out. For this usage only a part of the expect data, a so-called window of expect data, can be pre-loaded.

Alternatively, a managed cache which can be associated with more than one DUT can be used to pre-load expect data, or a window of expect data, and then compared with the received data from more than one DUT. Thereby, the expect data does not have to be loaded, or pre-loaded repeatedly for all devices.

Also the FIFO or managed cache memory can track the usage, e.g. the comparison with the received data, from the associated connected DUTs and discard data which has been used, i.e. compared, or does not need to be retained anymore for another reason.

In a preferred embodiment of the automated test equipment, the ATE recognizes a certain device under test as failing in response to finding, on the basis of the tracking of data usage, that the certain device under test does not follow a data stream.

It has been found, that in response to finding that a certain device under test provides data so slowly that the expect data in the managed cache associated with the certain device under test remains unused much longer than corresponding expect data associated with other devices under test, the DUT can be recognized as failing.

If in the case of a managed cache, the corresponding retained expect data only is maintained in the memory for one out of several DUTs, the efficiency could be affected detrimentally, and by considering the DUT for which the particular expect data is retained as failing, the expect data can be discarded from the managed cache and the overall efficiency can be improved. Also, if it is expected that the received data follow a certain data stream, or pattern, and a DUT does not deliver the received data in that data stream or pattern, it could be considered to be failing.

In a preferred embodiment of the automated test equipment, the ATE stores data in the memory in a compressed representation.

It has been found that compressed data uses up less memory space. The ATE can, generally, store different parts of the full data sets, for example only the received data which deviates from expect data and/or the expect data for which the receive data is different, or data describing a deviation between the received data and the expect data.

Some or all of the data stored in and/or by the ATE may be compressed to use up less memory space. The compression itself can be the same data compression method for all data that is to be stored compressed, but can also be different for different data command in dependence of certain parameters.

Examples for such parameters can e.g. be the type of test which is related to the data. Another example for such a parameter is the type of the device under test and/or the type of the ATE. Other parameters can relate directly to an involved device, e.g. temperature, usage statistics, memory status, available memory, available CPU, and the like. Other parameters can refer to the command or the payload, even whether the command is followed by payload at all, current time, transmission time, reception time, duration of transmission, etc . . .

The compression used for part or all of the data can be lossless or lossy compression.

Examples for lossless compression types that can be used include entropy type, e.g. Arithmetic, Asymmetric numeral systems, Golomb, Huffman, Range, Shannon, Shannon-Fano, Shannon-Fano-Elias, Tunstall, Unary, Universal, e.g. Exp-Golomb, Fibonacci, Gamma, Levenshtein, dictionary type, e.g. Byte pair encoding, Lempel-Ziv, or other types, e.g. BWT, CTW, Delta, DMC, DPCM, LDCT, MTF, PAQ, PPM, RLE (run-length encoding, e.g. for failing bits).

Examples for lossy compression types that can be used include transform type, e.g. Discrete cosine transform, DST, FFT, Wavelet, predictive type, e.g. DPCM, LPC, Motion, Psychoacoustic.

Also combinations of compression methods can be used.

In a preferred embodiment of the automated test equipment, the ATE can dynamically adjust the compression to match an expected error distribution.

It has been found to be efficient, when the received data contains register values, which leads to short bursts of errors once a register value is wrong. This can be effectively stored by a header with the byte offset when the error burst starts and a word of errors extending to one register value.

In a preferred embodiment of the automated test equipment, the ATE can keep received data that are likely failing within proximity in the received data stream.

It has been found that in high speed communications, for example via a serial USB or other HSIO technology, related bits can be buffered in the DUT, e.g. by a DFT, to stream them out within a small region of serial bits. In case the HSIO is USB, this could be effected by the USB-DFT. For example the value of a MISR, which is received over several scan chains, could be buffered. Here, MISR is a Multi-Input Signature Register, also called Multi-Input Shift Register, which is a sequential electronic circuit whose structure is essentially a Linear Feedback Shift Register, LFSR, which has been modified so that an exclusive or, XOR, gate drives the input of one or more of the LFSR's flip-flops.

If this register fails, many bits will be flipped and accordingly a burst of failing bits can be stored with a single offset value of its beginning within the overall receive stream (see above). Similarly, the DFT could buffer and burst-out data from an individual scan-chain. Also, the DFT may keep results of a single block coming from several scan chains buffered and burst those out separately from the results of another block.

In a preferred embodiment of the automated test equipment, the streaming error detection block further stores statistical information that is relevant to the analysis of failure.

It has been found that storing statistical information is beneficial for the evaluation of possibly occurring errors. Examples of such statistical information are counting the total number of failures, possibly by type as detailed above, and/or storing the byte-offset of the first failing cycle.

An embodiment comprises a method for automated testing of one or more devices under test, comprising receiving data, storing the received data, and providing the stored data to one or more of the devices under test.

This method is based on the same considerations as the above-described automated test equipment. However, it should be noted that the method can be supplemented by any of the features, functionalities and details described herein, also with respect to the automated test equipment. Moreover, the method can be supplemented by the features, functionalities, and details of the automated test equipment, both individually and taken in combination.

An embodiment according to the invention creates a computer program for performing the method described herein, when the computer program runs on a computer.

BRIEF DESCRIPTION OF THE FIGURES

Embodiments according to the present invention will subsequently be described taking reference to the enclosed figures in which:

FIG. 7 shows a block schematic diagram of an automated test equipment according to another embodiment of the present invention including a data store including an exemplary data flow of expect data, response data and fail data; and.

In the figures, similar reference signs denote similar elements and features.

DETAILED DESCRIPTION OF THE EMBODIMENTS

Figure 1:
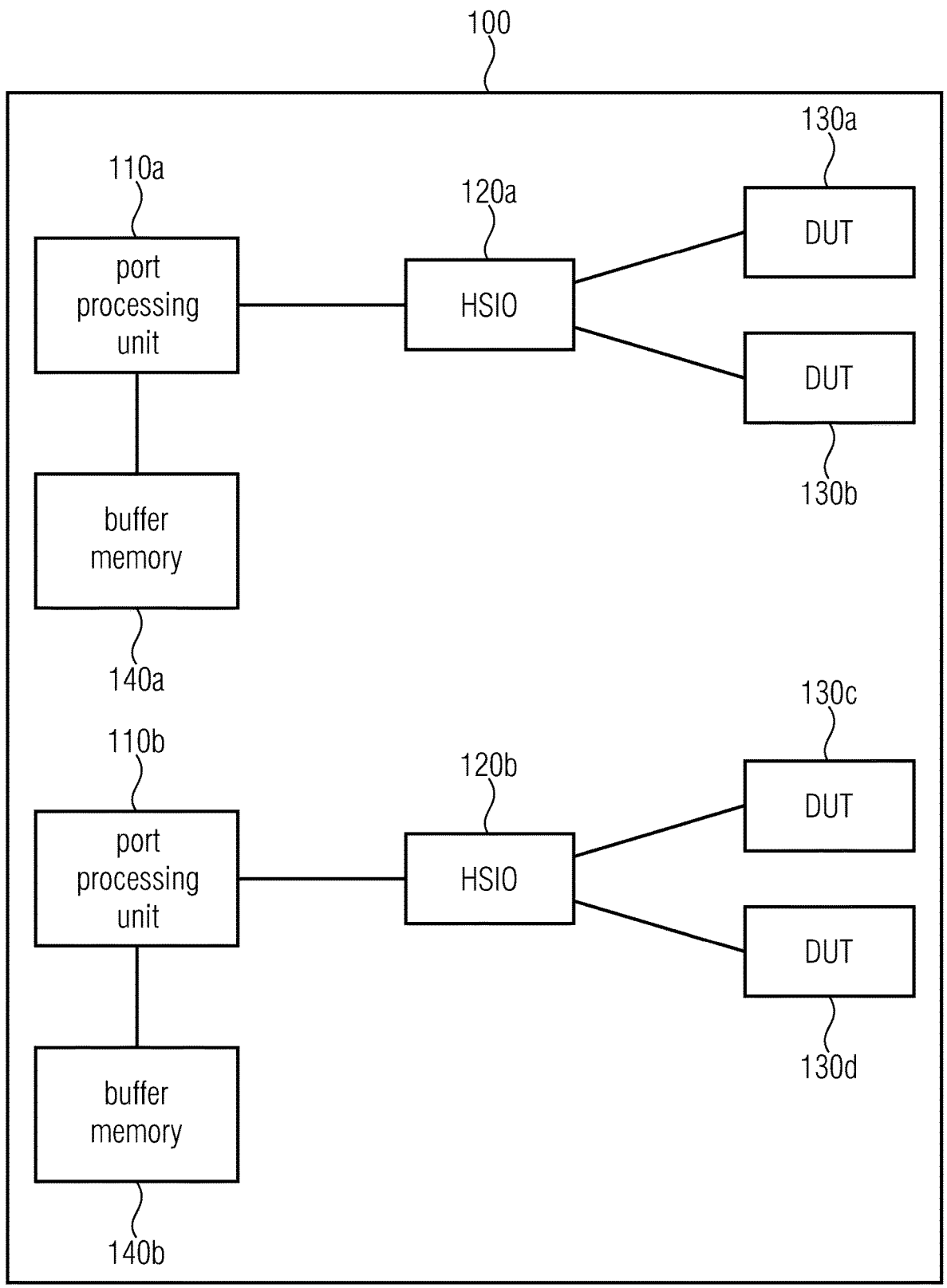
FIG. 1 shows a block schematic diagram of an automated test equipment according to an embodiment of the present invention.

FIG. 1 shows a block schematic diagram of an automated test equipment 100 according to an embodiment of the present invention. The automated test equipment, ATE, is for testing one or more devices under test, DUTs 130. The automated test equipment 100 comprises a plurality of port processing units, PPUs 110, which comprise a buffer memory 140, and a high-speed-input-output, HSIO, interface 120 for connecting with the devices under test 130.

The DUTs are tested, e.g. by providing them with test data, and receiving from them test results in various ways. The PPUs can receive this test data from an entity within the ATE or from the outside of the ATE. The PPUs then can store the received data in the buffer memory and provide the data to the DUTs via the HSIO.

Testing a device under test requires data transmission in both directions between the ATE and the DUTs. Some of these transmissions are transmitted via the HSIO.

The data, that the port processing units receive can be shared data. This for example can represent a setup where similar or identical DUTs are tested simultaneously. The simultaneous tests, which can still be the same, can however also be performed on different DUTs. The PPUs can receive the stimulus data, which is provided to the DUTs for the testing, and if the data is the same for all PPUs, the data can be considered shared data. This shared data is thus the same for the PPU, i.e. the data is shared between the port processing units. As stated above, an example for such shared data is shared stimulus data, that is sent to the DUTs for testing.

The data can for example be received from a shared memory pool or from another port processing unit, possibly via another port processing unit, as detailed below.

The data can provide the DUTs with test data, test signals, or test programs, and the data can be the data that the PPUs receive, or a processed version thereof, i.e. the data provided to the DUTs is data on the basis of the data, which can be shared. Alternatively, the data that the PPUs receive can also represent expected signals or expected results from the device under test which the DUTs return to the PPU after the test. This data can also be the expect data or require processing in the PPU, such that the expect data is data on the basis of the data received by the PPUs, which also might be shared data.

Any combination of the above is also possible, since the data that is provided to the one or more DUTs can be a combination of the options detailed above.

The buffer memories 140 can be accessibly from the PPUs 110 only, but can also be accessible by the HSIO 120 directly. The buffer memory, coupled to the PPU and/or the HSIO can—in either constellation—act as a local memory, in that it can be addressed as such.

By allowing the addressing of the buffer memory as a local memory, unnecessary translations of memory addresses can be avoided. One option to address the memory contents from the PPU and/or the HSIO is via direct memory access, DMA.

Figure 2:
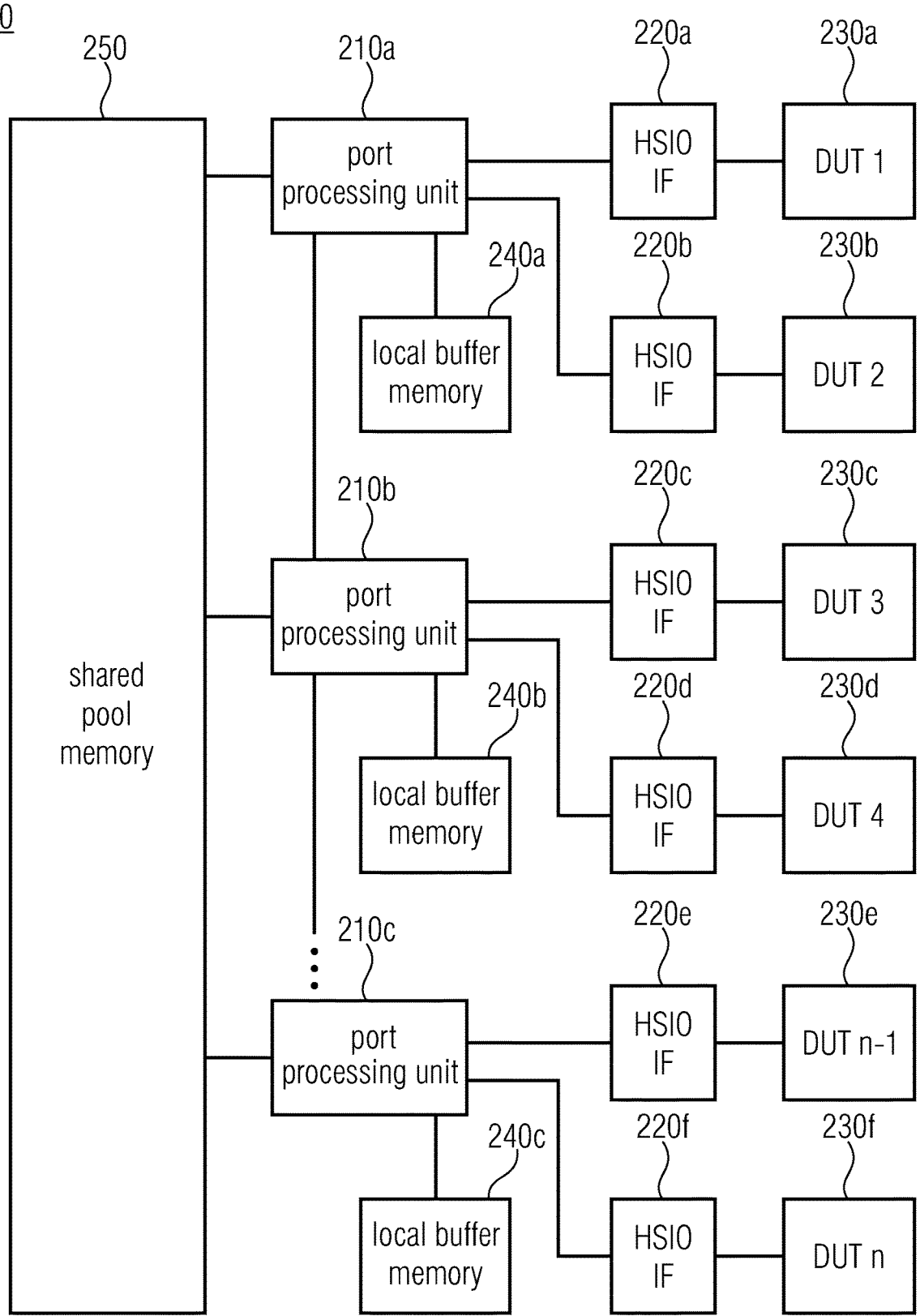
FIG. 2 shows a block schematic diagram of an automated test equipment according to another embodiment of the present invention including a data store.

FIG. 2 shows a block schematic diagram of an automated test equipment 200, which is similar to the ATE 100, according to an embodiment of the present invention. The automated test equipment, ATE, is for testing one or more devices under test, DUTs 230. The automated test equipment 200 comprises a plurality of port processing units, PPUs 210, which comprise a buffer memory 240, and a high-speed-input-output, HSIO, interface 220 for connecting with the devices under test 230. FIG. 2 further shows a data store 250, which as an exemplary implementation is denoted as shared pool memory in FIG. 2.

The data store 250 is connected to the PPUs 210, which are also connected to each other in form of a daisy chain. As an example only, in FIG. 2, a PPU 210 connects to a DUT 230 with one HSIO 220 dedicated to this connection, whereas in FIG. 1, each HSIO 120 can hold multiple connections with DUTs 130. Both variants are possible in every combination with other features according to the description.

The data store 250 can be or comprise a shared memory pool. The PPUs 210 can then receive data directly from the data store 250. The data store 250 can be an internal element of the ATE 200, but can also be an associated element outside of the ATE 200.

The PPUs receive data, which can be shared, from the data store 250 and/or the shared memory pool, respectively.

The data can be shared between port processing units, that means that the data which is shared between a plurality of port processing units can be received by the PPUs from the data store 250. The shared data can for example be shared stimulus data for testing of the DUTs 230, and the port processing units 210 receive the shared data from the shared memory pool 250. An exemplary usage is for example, to fill the buffer memory 240 with data received from the shared memory pool 250.

Data store 250 can stream shared data to one or more of the port processing units 210, and the data store 250 can store per-device, i.e. per-DUT, result data, e.g. results or result streams, into a plurality of memory areas. In particular these memory areas can be functionally and/or technically different. Thereby, the PPUs provide the results to the data store and since the data rates of the per-DUT result data may be different from each other, e.g. smaller, for example, at least by a factor of ten, than the data rate of another result or result stream, it might be beneficial to store the results, in dependence of their particular characteristics into different memory areas. Also, the volume and bandwidth required for storing results is significantly smaller than for shared stimulus data, therefore these might also be stored into different memory areas.

The port processing units, PPUs 210, can further forward shared data from the shared memory pool to at least one other port processing unit. In the embodiment, where the PPUs are connected to each other, or at least with one other PPU, the PPUs can forward the data to the other PPUs, or at least one other PPU. Thereby the memory accesses, i.e. read and write, from the PPUs to the data store 250 are reduced.

Likewise, the PPUs 210, can receive shared data from the shared memory pool from at least one other port processing unit. In the embodiment, where the PPUs are connected to each other, or at least with one other PPU, the PPUs can receive the data from the other PPUs, or at least one other PPU. Thereby the memory accesses, i.e. read and write, from the PPUs to the data store 250 are reduced, too.

A particular form of the above detailed connection of the PPUs is a daisy chain, where each PPU is connected to two other PPUs, such that a series of PPUs is achieved, and the first PPU is connected to the data store 250.

Other topologies are possible as well, e.g. mesh, star, fully connected, line, tree, bus. The first and last PPU might be connected to each other, too, such that a ring is formed, but they may also not be connected to each other, such that a series of PPUs is formed (true daisy chain). Each PPU might be connected with the data store 250.

Figure 3:
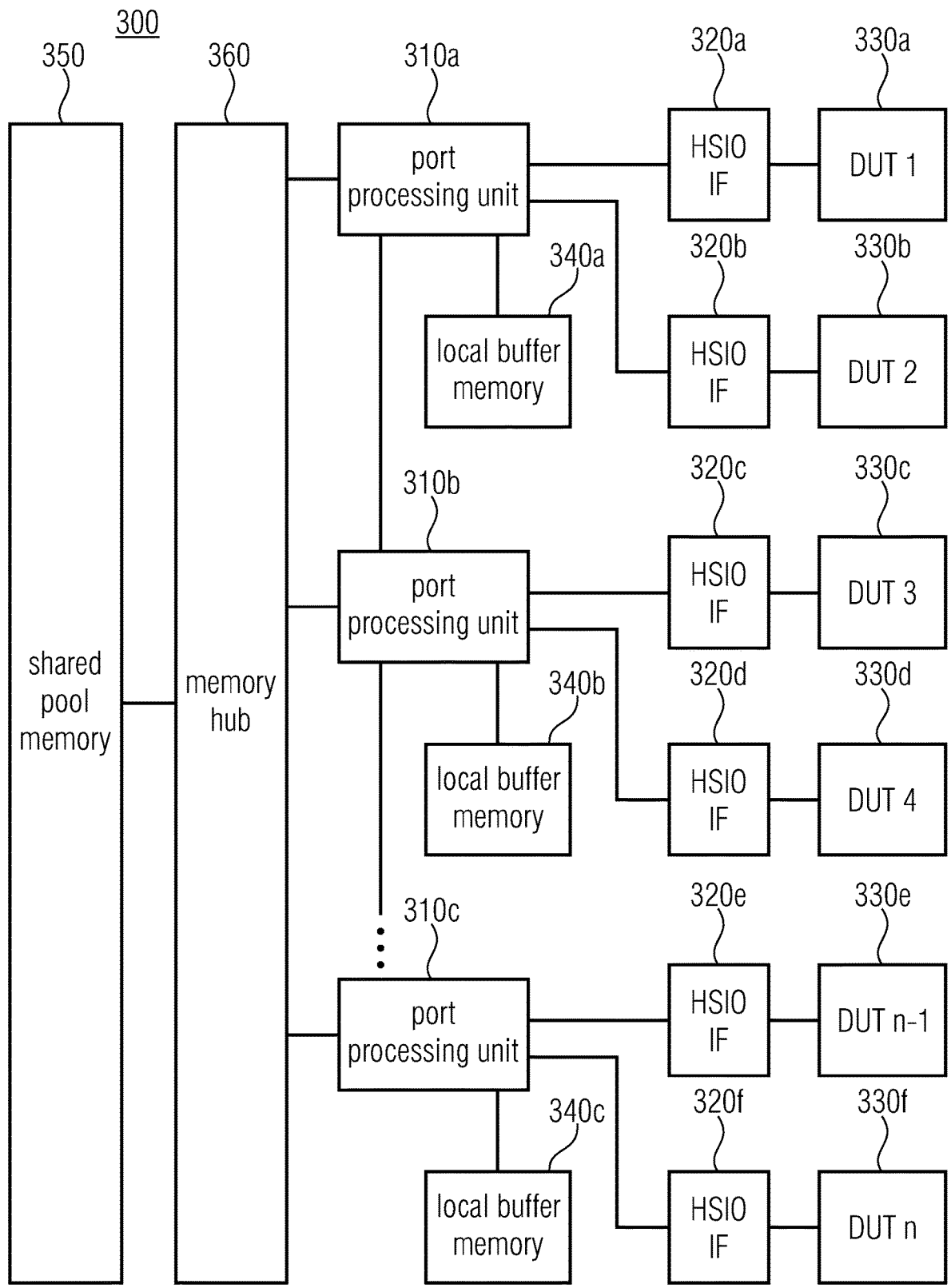
FIG. 3 shows a block schematic diagram of an automated test equipment according to another embodiment of the present invention including a data store and a memory hub.

FIG. 3 shows a block schematic diagram of an automated test equipment 300, which is similar to the ATE 100 and 200, according to an embodiment of the present invention. The automated test equipment, ATE, is for testing one or more devices under test, DUTs 330. The automated test equipment 300 comprises a plurality of port processing units, PPUs 310, which comprise a buffer memory 340, and a high-speed-input-output, HSIO, interface 320 for connecting with the devices under test 330. FIG. 3 further shows a data store 350, which as an exemplary implementation is denoted as shared pool memory in FIG. 3 and a memory hub 360.

According to this embodiment, the data store 350 can stream shared data to memory hub 360, from where the shared data can be transmitted to the PPUs 310. Memory hub 360 can enhance the overall efficiency of the ATE 300.

PPUs 310 can receive the shared data from the memory hub 360. If the memory hub 360 serves more than one PPU 310 with shared data, it could also be considered to be a central memory hub.

Other topologies are also possible, examples can be found at the description of FIG. 2.

For both variants as described in connection with FIGS. 2 and 3, as well as for the layout of FIG. 1, the PPUs 210, 310 can comprise a buffering memory 340 and/or one or more caches (not shown), in order to allow for a time-shift between receiving the shared data and using the shared data for testing one or more connected devices under test 330.

A first-in-first-out, FIFO, memory 340 helps to reduce delays and provide more of the required data for speeding up the processing of data. Likewise caches can be employed to reduce hold-ups in the processing and to have more of the data available at virtually the same time for usage by the PPU.

Each of the PPUs 210, 310 provides test information, which is based on the shared data, to one or more devices under test 230, 330 via an interface 220, 320. In dependence of the time needed to transfer this test information, the PPUs can characterize a device under test. Such characterization can be an identification of an individual DUT, determination of a certain type of a DUT, or result in the determination of a parameter for a DUT, e.g. fast/slow device, properly working/broken DUT, high-speed available yes/no, or similar or other parameters pertaining to the device and/or the test.

PPUs 210, 310 can provide test information e.g. a test program or test data, to the DUTs 230, 330 on the basis of the shared data via an interface, e.g. the HSIO 220, 320. Also the PPU 210, 310 can then characterize a device under test 230, 330, e.g. determine the DUT type and/or identify the DUT, in dependence on a timing of the transfer of the test information to the device under test. For that the timing of the transfer of the test information is determined or affected by the device under test, e.g. because the device under test controls the interface, e.g. as a master device, or because the device under test can slow down or interrupt the transfer as a slave device.

A PPU 210, 310 can characterize a device under test 230, 330 as failing if the transfer of test information to the device under test lags behind a reception of shared data by the respective port processing unit 210, 310 by more than a predetermined time.

In order to improve overall performance of the ATE 200, 300, a PPU 210, 310 can characterize or identify a DUT 230, 330 as failing, i.e. determine that the DUT is malfunctioning, if data transmission to or from the DUT exceeds a certain temporal threshold, i.e. if communication of the ATE with the DUT cannot be performed or completed within a predetermined time frame. The predetermined time frame, can e.g. be user-specified, device-specific, or test-specific.

FIGS. 4, 5, 6 and 7 show a block schematic diagram of an automated test equipment 400, 500, which is similar to the ATE 100, 200, 300 as described in FIGS. 1 to 3, according to an embodiment of the present invention including data flows. The automated test equipment, ATE, is for testing one or more devices under test, DUTs 130, 230, 330, 430, 530.

Figure 4:
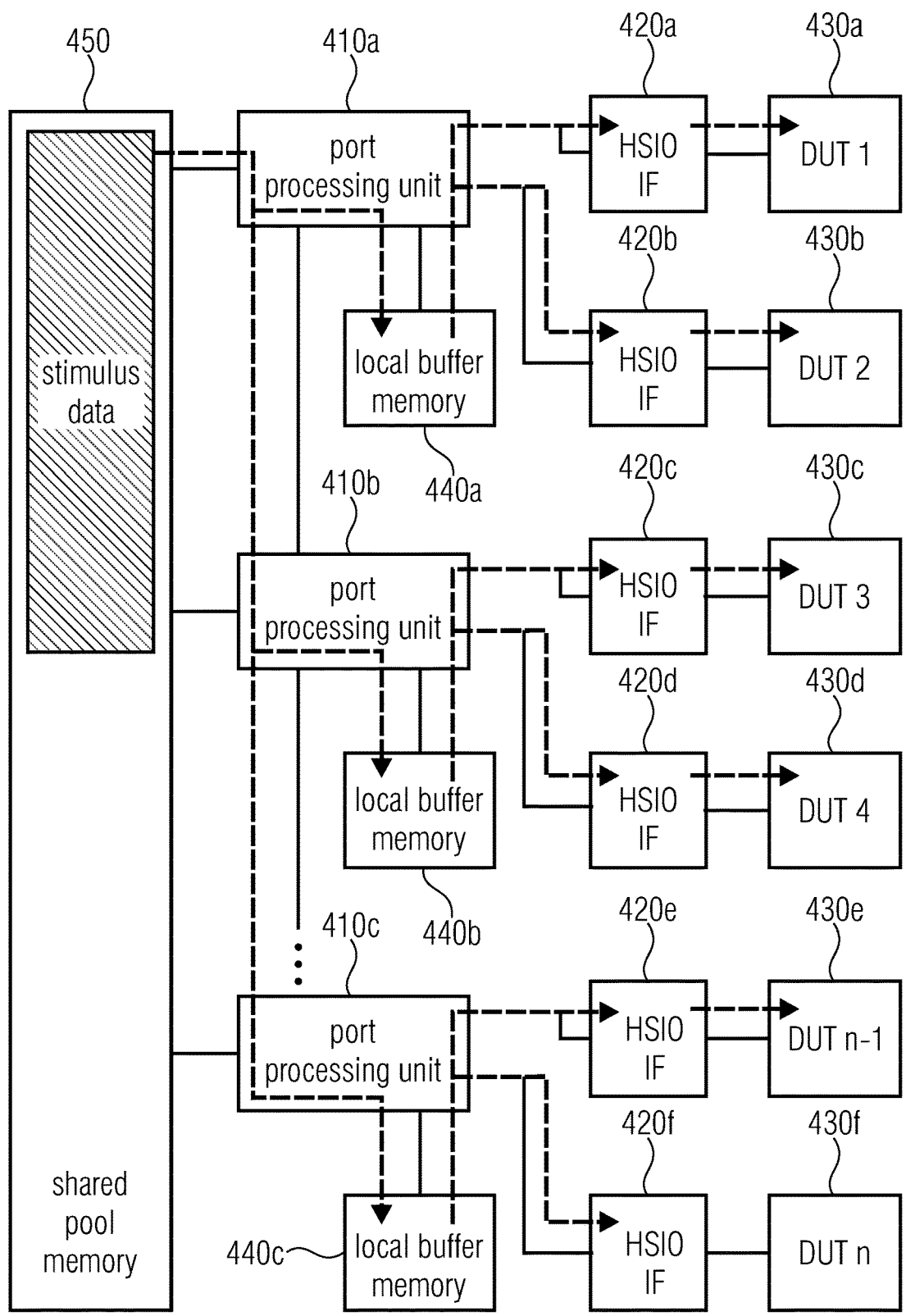
FIG. 4 shows a block schematic diagram of an automated test equipment according to another embodiment of the present invention including a data store including an exemplary data flow of stimulus data.
Figure 5:
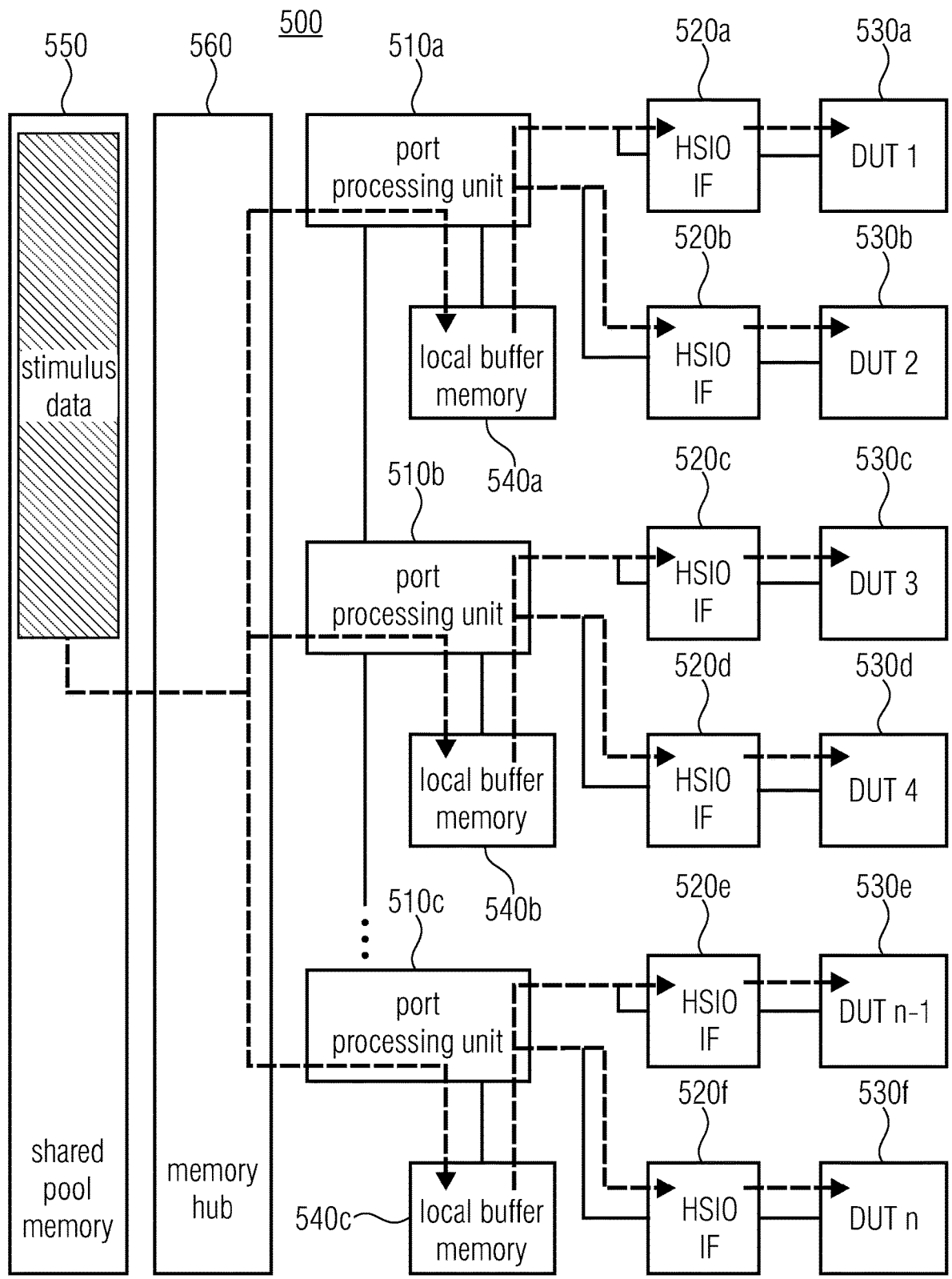
FIG. 5 shows a block schematic diagram of an automated test equipment according to another embodiment of the present invention including a data store and a memory hub including an exemplary data flow of stimulus data.

Exemplary data flows of the test information, e.g. stimulus data, is depicted in FIGS. 4 and 5. In FIG. 4 the data is transmitted from the data store 450 to one of the PPUs 410, from where it is, as described above, transmitted to another PPU 410, and from there to another PPU 410. In the PPUs, the data is stored in a local buffer memory 440 and from there, via a HSIO 420, transmitted to the connected DUTs 430.

This exemplary data flow is only shown for an exemplary topology. As detailed above, it is also possible that all of the PPUs 410 receive the data directly from the data store 450, or it could be possible that some of the PPUs 410 receive the data from the data store 450 directly, and other PPUs 410 receive the data from another PPU 410.

In FIG. 5 the data is transmitted from the data store 550 to the memory hub 560, from where the data is transmitted to the PPUs 510. In the PPUs, the data is stored in a local buffer memory 540 and from there, via a HSIO 520, transmitted to the connected DUTs 530.

After the test, the PPUs 210, 310, 410, 510 can obtain per-device result data from the DUTs 230, 330, 430, 530 and forward the per-device result data to the data store 250, 450. Optionally, the transfer is to the memory hub 360, 560, from where the data is transmitted to the data store 350, 550.

The ATE communication can overall be improved, if the PPUs 210, 310, 410, 510 obtain the result data, e.g. result streams or failure data, on a per-device, i.e. per-DUT, basis and forward the per-device result data, e.g. per-DUT result streams or per-DUT fail data to the data store 250, 350, 450, 550.

Figure 6:
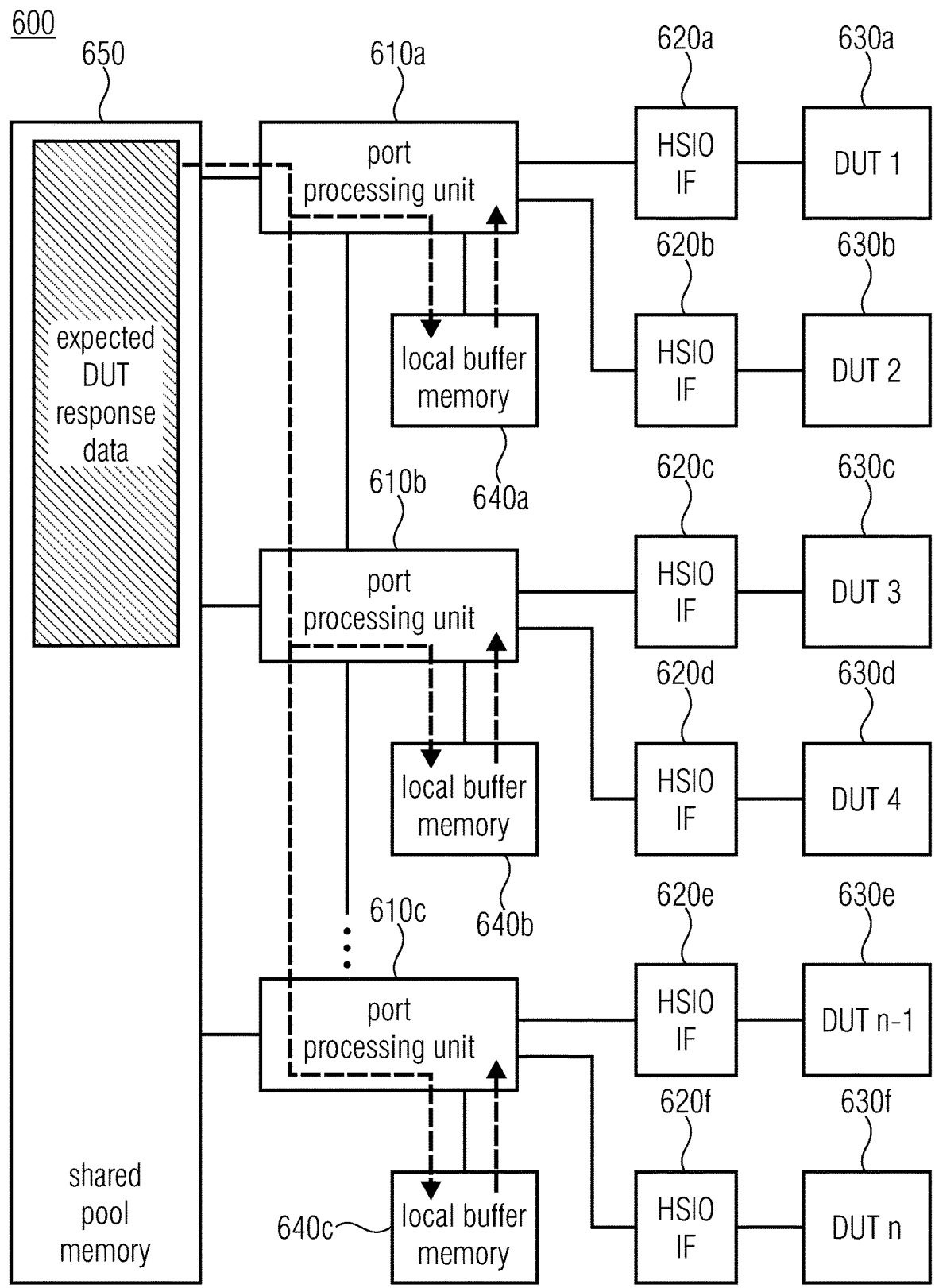
FIG. 6 shows a block schematic diagram of an automated test equipment according to another embodiment of the present invention including a data store including an exemplary data flow of expect data.

The PPUs 210, 310, 410, 510 can obtain the per-device result data using expect data which are based on the shared data. This expect data represented expected DUT response data. The expect data is stored in the data store 250, 350, 450, 550, 650, and as exemplary shown in FIG. 6, is transmitted to the PPUs 210, 310, 410, 510, 610 where it can be stored locally in the local buffer memory 240, 240, 440, 540, 640. In FIG. 6, only one PPU receives the data and passes it on to another PPU, from where it is again transmitted to another PPU. As described above, other data flows, i.e. all or some PPUs receive the data from the data store 250, 350, 450, 550, 650, and topologies, i.e. the data is transmitted to a memory hub 360, 560, are possible as well.

From the local buffer memory 240, 240, 440, 540, 640, the data is retrieved from the PPUs 210, 310, 410, 510, 610 as needed in order to process the expect data. For example to compare them with the actual response data of the DUTs 230, 330, 430, 530, 630.

Figure 7:
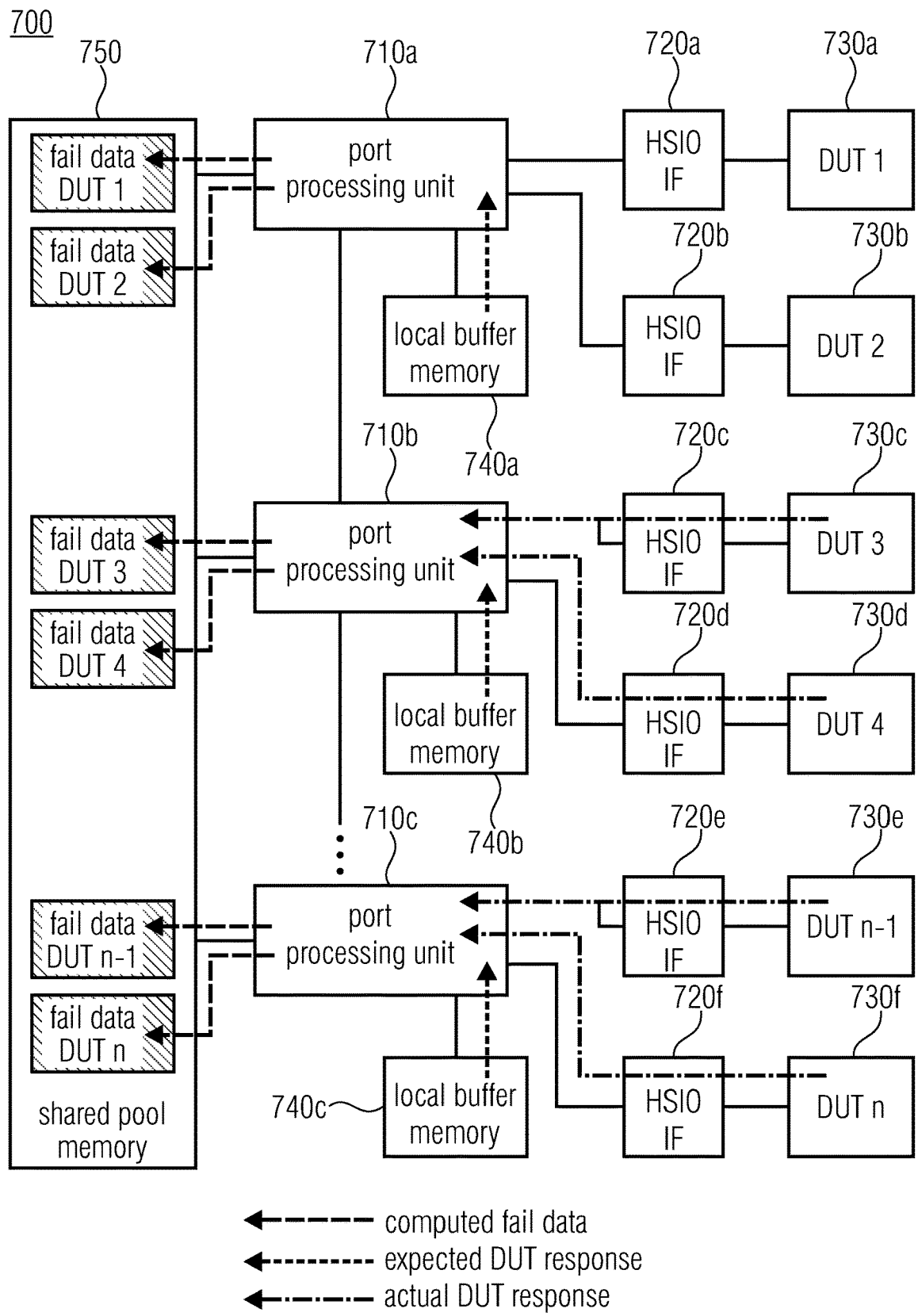

In FIG. 7 it is shown how the PPUs 210, 310, 410, 510, 610, 710 obtain the per-device result data, e.g. per-DUT result streams or per-DUT fail data using expect data, wherein the expect data are based on the shared data.

In particular, DUTs 730c, 730d, 730e and 730f return response data to the corresponding PPUs 710b and 710c via the respective HSIO interfaces, 720c, 720d, 720e and 720f. The PPUs 710b and 710c retrieve pertinent expect data from the local buffer memories 740b and 740c, where it was stored earlier as described in connection with FIG. 6.

The PPUs then compare the expect data and the receive data and possibly compute fail data, which can then be stored in the data store 750. Again the data flow of FIG. 7 is only exemplary. The usage of a memory hub is possible, as well as transmission between PPUs as discussed above.

The ATE 100, 200, 300, 400, 500, 600, 700 can comprise a memory hub for coupling a plurality of port processing units with the data store in a star architecture. The memory hub can also have a buffering memory and/or one or more caches, both not shown, to allow for a non-simultaneous forwarding of shared data to different port processing units.

A first-in-first-out, FIFO, memory can help to reduce delays and provide more of the required data for speeding up the processing. Likewise caches can be employed to reduce hold-ups in the processing and to have more of the data available at virtually the same time for usage by the memory hub. Thereby, by holding more of the shared data in a buffering memory or caches, the relevant data can be forwarded at different times to different PPUs without multiple read accesses to the shared memory pool or data store.

The data store 250, 350, 450, 550, 650, 750 can further have separate interfaces for the shared data which are provided to the port processing units and for the per-device result data, thereby also overall performance of the ATE can be improved.

The data store 250, 350, 450, 550, 650, 750 can also comprise a memory interface to access e.g. read out, per-device result data, e.g. for post processing or uploading, without interfering with a provision, e.g. by the data store via the HSIO or other interface, of shared data to the port processing units.

The PPUs 110, 210, 310, 410, 510, 610, 710 can further comprise a streaming error detection block, not shown, for detecting a command error in the received data, and comparing the received data with pre-loaded expect data, the expect data preferably comprising mask data. Testing a device under test generates result data which can be compared to expect data, which indicates what a properly functioning device under test would return as result. In order to verify the correct functioning of the device under test, DUT, so-called expect data can be prepared and pre-loaded at the ATE. The received data can then be compared with the expect data and thus the correct functioning of the device can be determined. The received data can refer to data from the scan chain, command and/or payload data. By using mask data, i.e. data defining which bits of the received data should contain which contests, the ATE can be enabled to process the data more intelligent. As an example, the expect data can contain mask data, which indicates that for a certain test procedure the received data will contain three blocks of data, the command indicating the pertinent test, the result data which was produced by the DUT and the seed data, which was used by the DUT to produce the result. Since the ATE supplied the DUT with the seed, storing of the seed might not be necessary in dependence of the test. Also, by selectively storing the result data, additional memory space can be saved.

The ATE can further pre-load the expect data into a per-device first-in-first-out, FIFO, memory or a managed cache associated with one or more connected devices, thereby, the expect data can be prepared for a quicker comparison with the received data. This is particular beneficial, if the received data is expected to be in a certain order, such that the first pre-loaded, first-in, data will also be the first to be compared and thus can be discarded from the FIFO first, too, first-out. For this usage only a part of the expect data, a so-called window of expect data, can be pre-loaded.

Alternatively, a managed cache which can be associated with more than one DUT can be used to pre-load expect data, or a window of expect data, and then compared with the received data from more than one DUT. Thereby, the expect data does not have to be loaded, or pre-loaded repeatedly for all devices.

Also the FIFO or managed cache memory can track the usage, e.g. the comparison with the received data, from the associated connected DUTs and discard data which has been used, i.e. compared, or does not need to be retained anymore for another reason.

The ATE can recognize a certain device under test as failing in response to finding, on the basis of the tracking of data usage, that the certain device under test does not follow a data stream, i.e. if a certain device under test provides data so slowly that the expect data in the managed cache associated with the certain device under test remains unused much longer than corresponding expect data associated with other devices under test, the DUT can be recognized as failing. If in the case of a managed cache, the corresponding retained expect data only is maintained in the memory for one out of several DUTs, the efficiency could be affected detrimentally, and by considering the DUT for which the particular expect data is retained as failing, the expect data can be discarded from the managed cache and the overall efficiency can be improved. Also, if it is expected that the received data follow a certain data stream, or pattern, and a DUT does not deliver the received data in that data stream or pattern, it could be considered to be failing.

The streaming error detection block can further store statistical information that is relevant to the analysis of failure.

As detailed in the summary, the data can also be stored in a compressed representation. This of course, refers to all memories and all data. And the compression can be dynamically adjusted. For example to match an expected error distribution.

The ATE can also keep received data that are likely failing within proximity in the received data stream, as discussed above.

It is noted that the ATE 100, 200, 300, 400, 500, 600, 700 can optionally be supplemented by any of the features, functionalities and details described herein, both individually and taken in combination.

The present invention also refers to a method for automated testing of one or more devices under test, comprising receiving data, storing the received data, and providing the stored data to one or more of the devices under test.

This method is based on the same considerations as the above-described automated test equipment. It is noted that the method can be supplemented by any of the features, functionalities and details described herein, also with respect to the automated test equipment. Moreover, the method can be supplemented by the features, functionalities, and details of the automated test equipment, both individually and taken in combination.

An embodiment according to the invention creates a computer program for performing the method described herein, when the computer program runs on a computer.

DETAILS AND EMBODIMENTS

In the following, some considerations underlying the present invention will be discussed and several solutions will be described. In particular, a number of details will be disclosed, which can optionally be introduced into any of the embodiments disclosed herein.

Motivation

Structural test enables systematic test coverage of individual structures ("cells") implementing the complex functions of a digital block within an SOC [System on a Chip]. Structural test includes a variety of test methods including, but not limited to Memory BIST, Logic BIST (pattern generated on-chip) and Scan Test (pattern externally provided). Individual tests are combined to test blocks: e.g. scan test is hierarchically applied to blocks (serially or in parallel).

Advanced structural test methodologies apply a combination of externally provided test data (stimulus from ATE [Automated Test Equipment]) and on-chip DFT [device for testing] that expands externally provided test data (seeds) into scan chains. Test results are compacted and compressed into a reduced amount of test data provided to the primary IO of a SOC (receive data) that the ATE compares with expected data (including the ability to mask receive data).

Without limiting the application of the proposed solution the following refers to Scan Test as general representation of structural test as described above.

However, there are challenges to cost-effectively scaling scan tests with the increasing complexity of SOCs enabled by new fabrication processes.

Escalating amount of test data that needs to be stored on the ATE

Escalating test times to feed the test data through the SOC IO

Increasing on-chip complexity challenging the distribution of test data to blocks-under-test and to create the required clock signals.

In addition, quality and reliability expectations of complex SOCs require structural test when the SOC is deployed in the end-application: e.g. in automobile or communication infrastructure system.

Several possible solutions to these challenges include:

Test Data Delivery through functional high-speed I/O interfaces: e.g. through USB or PCIe. This leads to the following:
Enables increased data rates
Enables structural test in the end-application
Requires decoupling of timing on ATE and on DUT [Device under testing] (as is typical for HSIO data comm's). Any accurate timing synchronization will require timing-sensitive signals between the DUT and ATE or other auxiliary equipment (e.g. oscilloscope).

Advanced on-chip test data processing, test scheduling and test data communication with blocks-under-test.
Typical elements proposed:
A communication protocol between the ATE and the HSIO-DFT: e.g. 1149.10
Using a network-on-chip (NOC) to flexibly route test data with local DFT managing the test application
Flexible test scheduling serially or in parallel for several blocks.
This leads to the following:
Requires complex interactions to effectively schedule test data transfer to and from the DUT
Enables higher-level communication (semantics) transferred over the test port offering new levels of control: e.g.
DFT providing pre-processed results that eases decision making and yield learning.
DFT controlling ATE power Aspect 1: Solution for Multi-Site Data Sharing, Data Streaming, Data Processing Issue: The escalating test data volume demands sharing test data across multiple sites tested in parallel:
Various types of data could be shared and need to be streamed from a shared data storage to the DUT interface ("port") or per-site processing units. Data that could be shared include the following but are not limited to:

Drive Data (Stimulus),
Expect Data (including Mask Data stored with Expect Data or in a separate memory region),
Auxiliary Data needed for post-processing results Data flow needs to keep up with the HSIO data rate minimizing impact on the resulting per-site test data transfer.

Ideally, data storage could be shared across all sites interfacing to the ATE's Port-Processing-Units. However, this would lead to prohibitively complex and expensive data interfaces. An appropriate architecture needs to be found to max. sharing without test execution impact.

Per-site data cannot be shared. These include:
Receive Data from the DUT
Results stored after comparing the Receive Data with the Expect Data
Per-Site Test Conditions: e.g. DUT-specific on-chip setup communicated to the DUT as preamble to the actual test data transfer.

Solution

Figure 8:
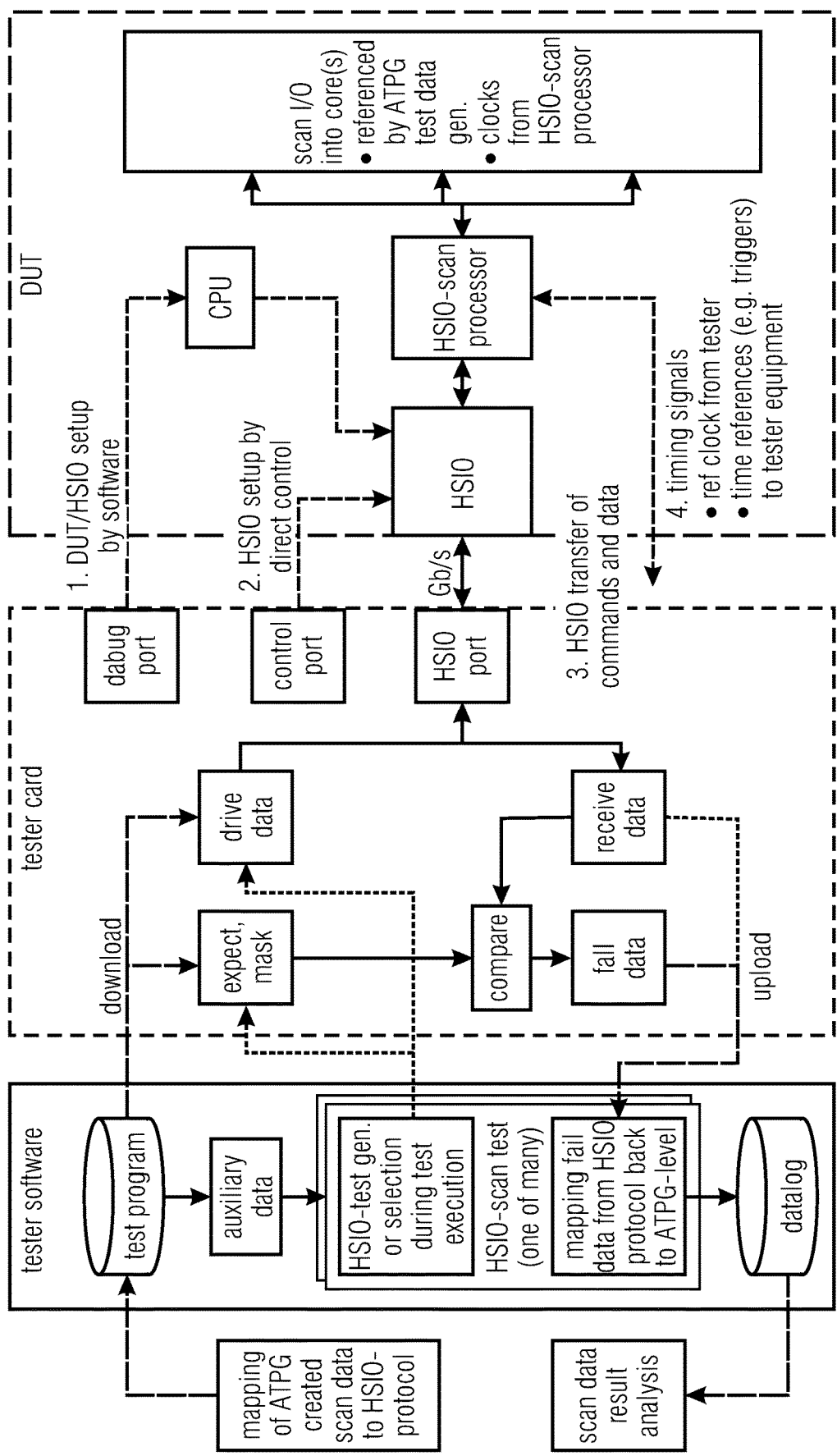
FIG. 8 shows a block schematic diagram of an exemplary automated test equipment according to another embodiment of the present invention including data flows.

FIG. 8 shows an exemplary data flow. However, it only represents a single site and does not distinguish the data store from the one or more port-processing units (PPU).

Solution Components:
1. Data Store:
    Memory subsystem on the ATE hardware implementing a large, shared pool of memory
    Typically, implemented as the fastest commodity RAM available.
    Used to stream shared data to the port-processing units. To minimize bandwidth utilization data shared for a multi-site test execution are preferably only read once by either a PPU or a memory hub.
    Used to store per-DUT result streams into controlled memory areas. The volume and bandwidth required for storing results is preferably significantly smaller than for shared stimulus data.
    There may be one or more data stores on an ATE card. Each data store requires a replication of the data flow architecture.
2. PPU—Port Processing Unit:
    Interfaces with one or many DUTs
    Implements HSIO, debug and control ports for DUTs
    Receives data from data store either directly or forwarded from another PPU (daisy-chain) or central memory hub.
    It uses buffering (FIFOs) and caches to minimize read-accesses to its data source.
    It gracefully handles failing respectively slow sites: E.g. User can specify a max. processing disparity indicating a devices is failing if is falls more than this number behind Receive.
    May forward shared data to one or more other PPUs
    Implements the per-DUT compare of Expect Data with Receive Data and calculates per-DUT Fail Data
    Sends Fail Data to the Data Store—potentially, through another PPU or Memory Hub.
3. Memory Hub (optionally):
    It is used to implement a star architecture.
    It offers data interfaces for each PPU
    It uses buffering (FIFOs) and caches to minimize read-accesses to the data store.
4. Result Data Store(s) (optionally):

Independent data stores for results may be attached to each PPU or centrally to a memory hub for the following reasons:

It offers a memory interface that is independent of the interface used to stream shared data to the PPUs It offers a memory interface to access result data for post-processing or uploading without interfering with the next test execution.

Aspect 2: Solution for Streaming Error Detection and Failure Compression

Issue: Traditional ATE in real-time samples the primary outputs from the structural tests and compares it with expect data (incl.) masking. This process is enabled by a deterministic, cyclical I/O of test data.

However, scan test through HSIO is inherently non-deterministic and bursted. Also, the scan output is payload data in a protocol stack: i.e. the data going to/from the scan chains are scrambled into a serial payload "tagged" with commands. USB receive data (commands and payloads) is stored in memory before it is processed: e.g. compared with expect data.

This approach has two problems:
1. The data processing has significant memory bandwidth requirements in storing received data and later reading it again to compare it with expected data stored on another memory location. This is further multiplied by testing several devices in parallel
2. The decision whether a scan pattern has failed is based on post-processing the data received through USB-packets. Worst case the comparing of received data with expect data dominates the overall execution time: i.e. it takes longer than the data streaming through the HSIO Solution A streaming error detection block embedded in the port-processing unit that compares just-received scan data with pre-loaded expect data to only write to memory when an actual error was detected. Note that expect data may include mask data.

In detail:
1. Using the data streaming architecture described above, a port-processing unit keeps a window of expect data available for comparing it with received data packets.
   The expect data are pre-loaded in a per-site FIFO or a managed cache that tracks the use of its data by all active sites before discarding the data. This avoids reading the expect data from the large data store—possibly, repeatedly for each site.
   In case a device does not follow the data stream, the PPU may raise an exception, declare the site as failing and store only the available error data.
2. On receiving scan data on the HSIO, the port processing unit compares the received data with the "matching" pre-loaded expect data.
   In case of HSIO communication as a deterministic stream of bytes, "matching" refers to comparing received data in the order of the pre-loaded expect data.
   In case of a DMA transfer of received data, the PPU matches the byte offset of the receive data written with the byte offset in the expect data. The byte offset acts like a memory address.
3. The error information is streamed out in a compressed representation to minimize data volume and memory interface bandwidth required. Beyond standard data compression (e.g. run-length encoding of failing bits), the streaming error detection block may implement test specific formats (e.g. as delivered by traditional ATE as well).

The compression may dynamically be adjusted to match the expected error distribution: e.g. the received data may contain register values, which leads to short bursts of errors once a register value is wrong. This can be effectively stored by a header with the byte offset when the error burst starts and a word of errors extending to one register value.

The compression of result data can be improved if the USB-DFT keeps receive data that are likely failing within proximity in the serial USB receive data stream. The USB-DFT could buffer related bits to stream them out within a small region of serial bits: e.g. buffer the value of a MISR register received over several scan chains. If this register fails, then many bits will be flipped and accordingly a burst of failing bits can be stored with a single offset value of its beginning within the overall receive stream (see paragraph above). Similarly, the USB-DFT could buffer and burst-out data from an individual scan-chain. Also, the USB-DFT may keep results of a single block coming from several scan chains buffered and bursted out separately from the results of another block.

Beyond the individual error information, the streaming error detection block stores statistics relevant to the analysis of failure: e.g. counting the total number of failures, storing the byte-offset of the first failing cycle.

4. A unique feature of result processing of scan-over-HSIO is that an error may not only occur in the payload of scan output data, but also in the command code as well: e.g.
   a. the HSIO-Scan DFT noticed an abnormality that it communicates out hereby breaking the command sequence.
   b. HSIO-Scan DFT itself is broken, which typically invalidates all the payload.
   A solution to this would store an additional expect data set with each bit describing whether its correspondent receive data bit is a command: Command-Flag Data Whenever an error is detected in a command, a "Command Error" flag is raised to qualify the result and speeds up the detection of unexpected process issues. Whenever such an error occurs, the streaming error detection block may switch into a mode minimizing the storage of useless and random payload data or possibly capturing the following bits as information payload on the state of the HSIO-Scan DFT block.
5. Beyond efficiently detecting that an error occurred and storing the result, streaming result processing may descramble the results such that the error map is not based on the bit-offset of the scan data packed into the serial USB stream with its command structure but directly refers to offsets of the block-IO: e.g. offsets into a scan-chain.
   The descrambling requires mapping information that need to be stored with the scan pattern as "annotations". It could be merged with the Command Flag Data to filter-out command data which are inherently irrelevant vs. the scan IO of a tested SOC-block.
   Furthermore, the mapping information may be different once receive data of different SOC-blocks are communicated. Accordingly, the descrambling process may first detect the payload type (e.g. stored in a block index of a command) before applying the correct descrambling map: e.g. how each bit in the payload maps to scan-chains—possibly, repeated for a long burst of payload.

In total the flow of streaming descrambling can be split into three phases that could be sequenced in an effective implementation:
a. Discarding command-data
b. Detecting payload type. This stage may also handle repeats of identically structured payload coded into a single command-frame
c. Descrambling payload with applicable mapping Aspect 3: Solution for Reducing Required Test Data Volume Issue: Test Data Volume is escalating. This impacts storage as well as required bandwidth in memory access and multi-site data streaming Solution Mask Data as well as Command-Flag Data may be compressed with algorithms that allow real-time decompression just before the actual compare with receive data. Since mask bits should be rare and more likely to be bursted, run-length encoding may be effective and simple to decode.

Command-Flag Data may be run-length encoded or algorithmically compressed: e.g. if a receive word is split into command and payload bits.

Aspect 4: Solution for Reducing the Time-Overhead of Sequencing Commands.

Issue: HSIO-Scan testing is surrounded by other actions: e.g. to setup the device before HSIO-Scan, to change test conditions between HSIO-Scan tests or to burst independent HSIO-Scan pattern tests. In all these cases the sequential execution of actions leads to overhead.

In a typical ATE this is minimized or entirely avoided by preparing the test data of the following action in FIFOs such that testing can continue without a break.

Solution

Actions controlling HSIO-Scan generally require support by the software-stack in a high-level operating system. Accordingly, preparing the test data of the following action requires parallel start of OS-level activities before the completion of the prior ones. This can be done by multi-threading, typically available by a state-of-the-art operating system (e.g. Linux). However, the activities at the DUT Interface have to be in order. Accordingly, transmitting of the USB data has to be paused until prior action is completed.

Pausing the HSIO-Scan data transmission requires interference with the protocol stack of the specific HSIO port: e.g. For PCIe: The PCIe may continue driving IDLE until the prepared frames can be started. If it's a DMA access from the DUT, then the PCIe could be fully prepared and just waiting until the DUT engages in the DMA data transfer after the prior actions is complete Pausing the data transmission requires appropriate changes of the HSIO stack in the HSIO IP: e.g. the HSIO may have two Pipelines preparing transmissions. Every time one of them stays armed/gated until a trigger is received to release the data transmission in the next available slot. The trigger may either be a low-level software command or an electrical trigger received from another instrument or even the DUT itself.

Aspect 5: Solution for Keeping Test Setup, Test Data and Test Data Flow Decoupled from HSIO Port Specifics Issue: HSIO interfaces are programmed in various ways on different operating systems and with varying drivers. Typical variations the test equipment will need to support include but are not limited to:
Varying HSIO ports including USB, PCIe, 1149.10 or even proprietary interfaces
HSIO operated as host/root or as end-point
ATE actively streaming test data to the DUT or DUT pulling data from ATE (DMA)
HSIO communication through standard interfaces or requiring a custom driver However, ATE and test programs need to enable generic, configurable test setups and use-cases.

Solution

The ATE solution allows reconfiguring the Port-Interface within a test program: e.g. from PCIe Endpoint to 1149.10 test interface.

The ATE software supports 2 or more generic use-models enabled by a virtual "Instrument" that can apply to one or more HSIO types: e.g.
Push-mode—streaming (typical for USB, 1149.10): the ATE actively pushes the stimulus data into the HSIO comm's
DMA-mode (typical for PCIe): The DUT maps the OCST memory into its memory space and reads data from/to it.

Adding hooks within the system to enable the customer or a $3^{rd}$ party to adjust the standard block according to the proprietary interface: e.g.
define a standard Interface for implementing a custom port according to a selected use-model: e.g. DMA.
efficient custom/3rd party code running on the OCST card to analyze the received packages for yield learning. In this case the Expect Data may contain supporting information rather than direct comparable expect data.
Per-DUT Encryption just before pushing the data into the HSIO.
Allow per-site mapping of addresses used by the DUT writing results in DMA-Mode. This will keep the physical receive memory distinct even if the DMAs of each site are identical.

CONCLUSIONS

To conclude, the embodiments described herein can optionally be supplemented by any of the important points or aspects described here. However, it is noted that the important points and aspects described here can either be used individually or in combination and can be introduced into any of the embodiments described herein, both individually and in combination.

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An automated test equipment for testing one or more devices under test, the automated test equipment comprising:
   a plurality of port processing units, comprising at least:
      a respective buffer memory, and
      a respective high-speed-input-output (HSIO) interface for connecting with at least one of the one or more devices under test;
   a data store comprising a shared memory pool, wherein the plurality of port processing units are further configured to receive shared data from the shared memory pool; and
   a per-device FIFO memory operable to pre-load the expected data and associated with one or more devices under test that are connected, wherein the per-device FIFO memory is configured to track data usage by the associated one or more devices under test that are connected, configured to discard the data, and further configured to recognize a certain device under test as failing in response to determining, on the basis of the tracking of data usage, that the certain device under test does not follow a data stream,
   wherein each of the plurality of port processing units is configured to:
      receive data;
      store received data in the respective buffer memory; and
      provide the data stored in the respective buffer memory to the one or more devices under test that are connected, the data provided via the respective HSIO interface and for testing the one or more devices under test that are connected,
      wherein each of the plurality of port processing units further comprises a streaming error detection block configured to detect a command error in the received data, and further configured to compare the received data with pre-loaded expected data, and wherein the expected data comprises mask data.

2. The automated test equipment according to claim 1, wherein the respective buffer memory is accessible by the respective HSIO interface as local memory.

3. The automated test equipment according to claim 1, wherein the data store is configured to stream shared data to one or more of the plurality of port processing units and to a memory hub.

4. The automated test equipment according to claim 1, wherein the data store is configured to store per-device result data into a plurality of memory areas of the plurality of post processing units.

5. The automated test equipment according to claim 1, wherein one or more of the plurality of port processing units are further configured to forward shared data from the shared memory pool to at least one other port processing unit of the plurality of post processing units.

6. The automated test equipment according to claim 1, wherein one or more of the plurality of port processing units are configured to receive shared data from at least one other port processing unit.

7. The automated test equipment according to claim 1, wherein one or more of the plurality of port processing units form a daisy chain to successively forward the shared data from the shared memory pool.

8. The automated test equipment according to claim 1, wherein one or more of the plurality of port processing units are configured to receive shared data from a memory hub.

9. The automated test equipment according claim 1, the respective buffer memory of each of the plurality of port processing units is operable to allow for a time-shift between a reception of the shared data and a usage of the shared data for testing the one or more devices under test that are connected.

10. The automated test equipment according claim 1, wherein at least one of the plurality of port processing units is further configured to transfer test information based on the shared data to a device under test via an interface, and to characterize the device under test based on a timing of the transfer of the test information to the device under test.

11. The automated test equipment according to claim 10, wherein a respective post processing unit of the plurality of port processing units is configured to characterize a device under test as failing if a transfer operation of test information to the device under test lags behind a reception operation of the shared data by the respective port processing unit by more than a predetermined duration.

12. The automated test equipment according to any one of claim 1, wherein the plurality of port processing units are further configured to obtain per-device result data and further configured to forward the per-device result data to the data store.

13. The automated test equipment according to claim 12, wherein the plurality of port processing units are further configured to obtain the per-device result data using expected data which is based on the shared data, wherein the expected data indicates data that a properly functioning device under test is expected to return.

14. The automated test equipment according to claim 1, further comprising a memory hub configured to couple the plurality of port processing units with the data store in a star architecture.

15. The automated test equipment according to claim 14, wherein the memory hub comprises a buffering memory and one or more caches to allow for a non-simultaneous forwarding of the shared data to different port processing units of the plurality of post processing units.

16. The automated test equipment according to claim 1, wherein the data store further comprises separate interfaces for the shared data which are provided to the plurality of port processing units and for the per-device result data.

17. The automated test equipment according to claim 1, wherein the data store comprises a memory interface configured to access per-device result data transparently to a provision of shared data to the plurality of port processing units.

18. The automated test equipment according to claim 1, wherein each of the plurality of processing units is configured to store data in the memory in a compressed representation, wherein the compressed representation comprises a standard data compression format or a test specific format.

19. The automated test equipment according to claim 18, wherein each of the plurality of processing units is further configured to dynamically adjust a compression associated with the compressed representation to match an expected error distribution.

20. The automated test equipment according to claim 18, wherein each of the plurality of processing units is further configured to maintain the received data corresponding to data that indicates likely failure within proximity in a received data stream.

21. The automated test equipment according to claim 1, wherein the streaming error detection block is further configured to store statistical information relevant to a failure analysis.

22. A method for automated testing of one or more devices under test, comprising:
receiving data at a port processing unit of a plurality of port processing units from a data store comprising a shared memory pool, wherein each of the plurality of port processing units comprises a respective buffer memory, and a respective high-speed-input-output (HSIO) interface for connecting with at least one of the one or more devices under test;
storing received data in a respective buffer memory of a port processing unit; and
providing stored data to the one or more devices under test via the respective HSIO interface operable to connect to the one or more devices under test, wherein the respective HSIO is operable to access the respective buffer memory as local memory,
wherein each of the plurality of port processing units comprises a streaming error detection block configured to:
detect a command error in the received data;
compare the received data with pre-loaded expected data, wherein the expected data comprises mask data;
and wherein each of the plurality of port processing units is configured to:
store data in a compressed representation, wherein the compressed representation comprises a standard data compression format or a test specific format; and
dynamically adjust a compression associated with the compressed representation to match an expected error distribution.

23. A non-transitory computer-readable medium having computer-readable program code embodied therein for causing a computer system to perform a method for automated testing of one or more devices under test, the method comprising:
receiving data at a port processing unit of a plurality of port processing units from a data store comprising a shared memory pool, wherein each of the plurality of port processing units comprises a respective buffer memory, and a respective high-speed-input-output (HSIO) interface for connecting with at least one of the one or more devices under test;
storing received data in a respective buffer memory of a port processing unit; and providing stored data to the one or more devices under test via a respective HSIO interface operable to connect to the one or more devices under test, wherein the respective HSIO is operable to access the respective buffer memory as local memory, and wherein a respective post processing unit of the plurality of port processing units is configured to characterize a device under test as failing if a transfer operation of test information to the device under test lags behind a reception operation of the shared data by the respective port processing unit by more than a predetermined duration.

\* \* \* \* \*